United States Patent
Borot et al.

(10) Patent No.: US 6,363,001 B1
(45) Date of Patent: Mar. 26, 2002

(54) ROM WITH A REDUCED STATIC CONSUMPTION

(75) Inventors: Bertrand Borot, Crolles; Stéphane Hanriat, Saint Vincent de Mercuze, both of (FR)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/569,563

(22) Filed: May 12, 2000

(30) Foreign Application Priority Data

May 12, 1999 (FR) .......................................... 99/06243

(51) Int. Cl.$^7$ .............................................. G11C 17/00
(52) U.S. Cl. ................. 365/104; 365/189.07; 365/182; 365/230.03
(58) Field of Search ................................ 365/104, 182, 365/94, 129, 230.03, 230.01, 189.07, 189.01

(56) References Cited

U.S. PATENT DOCUMENTS

| | | | |
|---|---|---|---|
| 4,426,686 A | | 1/1984 | Yamamoto et al. ......... 365/104 |
| 5,477,484 A | * | 12/1995 | Nakashima .................. 365/182 |
| 5,703,820 A | * | 12/1997 | Kohno ........................ 365/204 |
| 5,745,401 A | * | 4/1998 | Lee ............................. 365/104 |
| 5,787,033 A | * | 7/1998 | Maeno ........................ 365/182 |
| 5,930,180 A | * | 7/1999 | Callahan ................ 365/189.09 |

FOREIGN PATENT DOCUMENTS

EP 0 040 045 11/1981

* cited by examiner

*Primary Examiner*—Hoai V. Ho
(74) *Attorney, Agent, or Firm*—Lisa K. Jorgenson; Robert Iannucci; SEED IP Law Group, PLLC

(57) ABSTRACT

A ROM including memory cells, the programmed cells being formed of a transistor connected between a bit line and a supply potential, the cells being organized in sets of at least one column coupled to one sense amplifier per set. The cell programming is inverted with respect to a desired programming only in specific sets where the desired programming would result in a number of programmed cells greater than the number of unprogrammed cells, the logic state provided by the sense amplifiers associated with the specific sets being inverted.

10 Claims, 2 Drawing Sheets

ROM WITH A REDUCED STATIC CONSUMPTION

BACKGROUND OF THE INVENTION

1. Field of the Invention

The present invention relates to a ROM structure, the static consumption of which is decreased by an inversion of the cell programming according to the relation between the number of programmed cells and the number of unprogrammed cells.

2. Discussion of the Related Art

FIG. 1 schematically shows a conventional ROM structure. It includes a plurality of memory cells 10 arranged in rows and columns. The cells 10 of each row are selected by a respective word line W, and a selected cell presents its data on a bit line BL common to the cells of the same column.

Each bit line BL is connected to a high supply potential Vdd via a respective P-channel MOS precharge transistor MP. All precharge transistors MP are controlled by a common precharge line P.

Further, bit lines BL are connected to sense amplifiers 12. Generally, the bit lines are grouped in several sets, each set being associated with a single sense amplifier 12 via a multiplexer 14. Each multiplexer 14 selects the bit line of the set to be provided to the amplifier according to the read address presented to the memory.

As shown, the programmed cells 10 include an N-channel MOS transistor MN connected between the corresponding bit line and the low supply potential, while the unprogrammed cells 10 include no transistor. The transistors MN of the cells of a same row are all controlled by the corresponding word line W.

With recent integrated circuit manufacturing technologies, transistors become smaller and smaller but have greater and greater leakages. As a result, the static consumption of the circuits formed by means of these technologies tends to increase if no particular precautions are taken. The static consumption of a circuit is particularly disturbing in devices supplied by a battery.

In the memory of FIG. 1, even if no transistor is turned on, for example in a stand-by mode, there nevertheless exists a leakage current path between high potential Vdd and the low potential via each precharge transistor MP and each transistor MN of the same column. The static consumption is proportional to the number of transistors MN in the memory, that is, to the number of programmed cells.

To reduce the static consumption, it has been devised to invert the programming of the entire memory when the number of cells that would normally be programmed is greater than the number of cells that would normally not be programmed. Of course, the memory outputs, that is, the outputs of sense amplifiers 12, are then inverted to restore the required logic levels.

A static consumption that is always lower than half that of a memory in which all cells would be programmed is thus obtained.

A disadvantage of this solution, given that it may be assumed that the cells are programmed according to a random law, that in average, 50% of the cells are programmed. The obtained consumption gains thus correspond to the variations around this average value and are insignificant, except in very specific cases.

U.S. Pat. No. 5,745,401 claims that each column of cells may be programmed in a conventional programming mode or in an inverted programming mode. This could cause a substantial consumption gain. However, patent '401 also claims the use of a decoder adapted to record whether each column is programmed in the conventional programming mode or in the inverted programming mode. Such a decoder increases the surface of the circuit and its access time.

SUMMARY OF THE INVENTION

An object of the present invention is to provide a ROM structure enabling significant reduction of the static consumption, without increasing the surface and the access time of the structure.

To achieve this object, an embodiment of the present invention provides a ROM including memory cells, of which those that are programmed are formed of a transistor connected between a bit line and a supply potential, the cells being organized in sets of at least one column coupled to one sense amplifier per set. The cell programming is inverted with respect to a desired programming only in specific sets where the desired programming would result in a number of programmed cells greater than the number of unprogrammed cells, the logic state provided by the sense amplifiers associated with the specific sets being inverted. Each sense amplifier is formed of at least two stages interconnected by two differential lines, the differential lines being interchanged for the sense amplifiers associated with the specific sets.

The foregoing objects, features and advantages of the present invention will be discussed in detail in the following non-limiting description of specific embodiments in connection with the accompanying drawings.

DETAILED DESCRIPTION

To reduce the static consumption of a ROM, it is also provided according to an embodiment of the present invention to invert the cell programming according to the cases. The cells are analyzed by isolated sets of columns and the programming only of the cells of the analyzed set is inverted, if necessary. The sets that can be so analyzed are the sets of columns respectively associated with the sense amplifiers. A ROM in which some sets of columns have an inverted programming while the remaining sets have a normal programming is thus obtained. The states provided by the sense amplifiers associated with the sets of which the programming has been inverted are inverted to provide the initially desired logic states.

Figure 1:
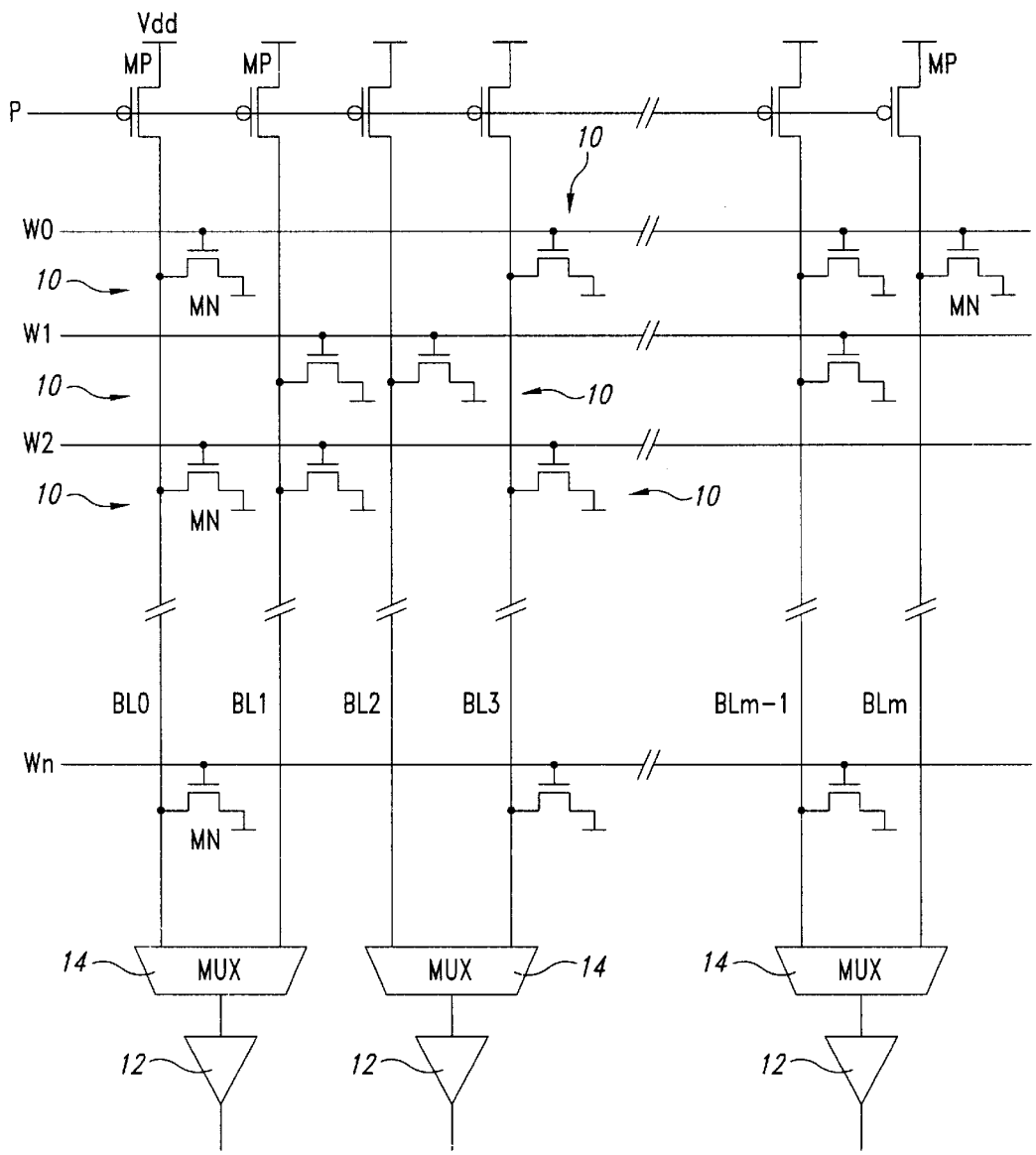
FIG. 1, previously described, schematically shows a conventional ROM structure.
Figure 2:
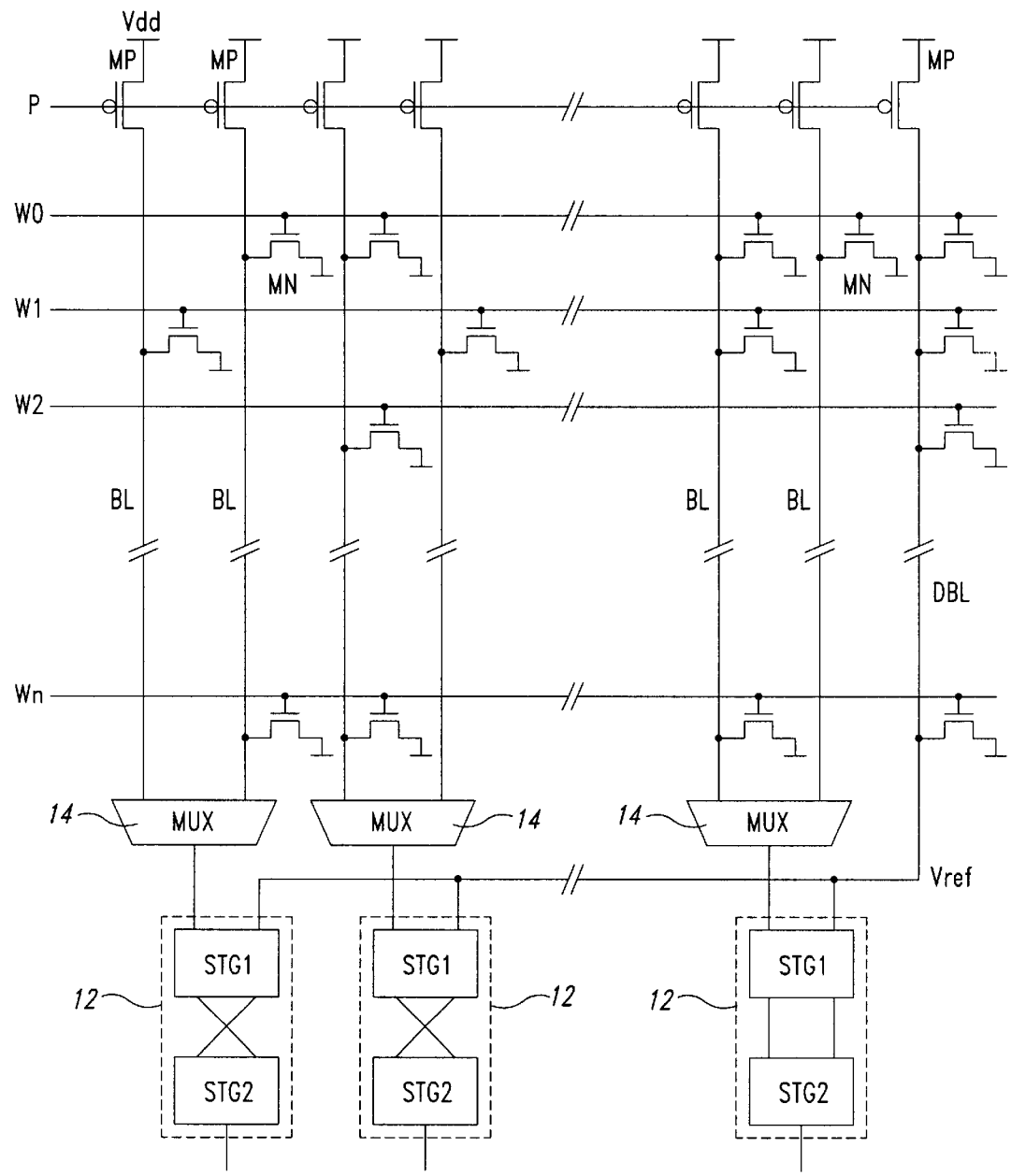
FIG. 2 schematically shows an embodiment of a ROM according to the present invention.

FIG. 2 shows an example of a ROM structure according to the present invention, in which the programming of the two first sets of columns (associated with the two first multiplexers 14) has been inverted. To better illustrate this principle, it has been assumed that the desired programming is the same as for the memory of FIG. 1. Thus, in the two first sets of columns, transistors MN are found in the cells where there used to be no transistor in FIG. 1, and no transistor is found in the cells where there used to be a transistor MN in FIG. 1.

However, the programming of the last set of columns has not been inverted. Transistors MN are found in the same columns as in FIG. 1.

The logic states provided by the sense amplifiers 12 associated with the two first sets must be inverted. Adding an inverter introduces a delay in the propagation of the memory output signal, which delay reduces the memory access speed. Using a decoder increases the surface area of the structure.

FIG. 2 shows a solution avoiding this delay and surface increase. Generally, sense amplifiers 12 are comparators that compare the outputs of the corresponding multiplexers 14 with a reference value Vref generally sampled on a reference bit line DBL. Reference bit line DBL corresponds to a column in which all cells are programmed. Like a normal bit line, reference bit line DBL is connected to high potential Vdd by a precharge transistor MP controlled in the same way as all other precharge transistors MP.

With this solution, reading from the memory is particularly fast, since a small potential difference between reference line Vref and the output of multiplexers 14 is sufficient to make out a programmed state from an unprogrammed state. However, this small potential difference must be converted into an exploitable logic level, and it must for this purpose be amplified with a high gain. To reach the required gain, sense amplifiers 12 include, as shown, two gain stages, the second one of which is differentially controlled by the first one.

To perform the required state inversion for the first two amplifiers, the differential signals provided by the first stage to the second one are interchanged. This crossing of the signals introduces no propagation delay.

The present invention has been described by means of an example of a memory with two columns per sense amplifier. It of course applies to memories with a single column per amplifier or to memories with more than two columns per amplifier.

If necessary, sense amplifiers including more than two stages will be used. Then, if a state inversion is required, it occurs by interchanging the differential signals only once between any two of the stages.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A ROM, comprising memory cells that include programmed cells formed of a transistor connected between a bit line and a supply potential, the cells being organized in sets of at least one column coupled to one sense amplifier per set, wherein specific sets of cells have a cell programming that is inverted with respect to a desired programming only where the desired programming would result in a number of programmed cells greater than a number of unprogrammed cells, a logic state provided by the sense amplifiers associated with the specific sets being inverted, and wherein each sense amplifier includes at least two stages interconnected by two differential lines, the differential lines being interchanged for the sense amplifiers associated with the specific sets.

2. The ROM of claim 1, wherein each set includes several columns coupled to the respective sense amplifier by a multiplexer.

3. The ROM of claim 1 wherein for each of the sense amplifiers, the first stage includes first and second outputs and the second stage includes first and second inputs coupled to the first and second outputs of the first stage.

4. The ROM of claim 3 wherein for a first one of the sense amplifiers the inputs of the second stage are cross-coupled with the outputs of the first stage and for a second one of the sense amplifiers the inputs of the second stage are not cross-coupled with the outputs of the first stage.

5. A ROM, comprising:
a first column of memory cells, the first column being coupled by a first bit line to a voltage source;
a second column of memory cells, the second column being coupled by a second bit line to the voltage source;
a first sense amplifier coupled to the first column by the first bit line, the first sense amplifier being an inverting amplifier such that the first sense amplifier outputs cell values that are inverted with respect to cell values that are sensed for the memory cells of the first column; and
a second sense amplifier coupled to the second column by the second bit line, the second sense amplifier being a non-inverting amplifier such that the second sense amplifier outputs cell values that are not inverted with respect to cell values that are sensed for the memory cells of the second column, wherein the first sense amplifier includes two stages interconnected by two differential lines that are cross-coupled to invert the sensed cell values to produce the cell values output by the first sense amplifier.

6. The ROM of claim 5 wherein the second sense amplifier includes two stages interconnected by two differential lines that are not cross-coupled.

7. The ROM of claim 5, further comprising:
a third column of memory cells connected by a third bit line to the voltage source; and
a multiplexer coupling both of the first and third columns to the first sense amplifier which outputs cell values that are inverted with respect to cell values that are sensed for the memory cells of the third column.

8. The ROM of claim 5 wherein a first one of the memory cells of the first column is a programmed cell that includes a cell transistor connected between the first bit line and a reference potential and a second one of the memory cells of the first column is an unprogrammed cell that does not include a cell transistor.

9. A ROM, comprising:
an array of memory cells grouped into sets of memory cells, each set including one or more columns of memory cells, the cells of each set including at least as many unprogrammed cells as programmed cells, where each programmed cell includes a cell transistor and each unprogrammed cell does not include a cell transistor; and
a plurality of sense amplifiers, a first portion of the sense amplifiers being inverting sense amplifiers and a second portion of the sense amplifiers being non-inverting sense amplifiers, wherein the sense amplifiers of the first portion each include two stages interconnected by two differential lines that are cross-coupled to invert sensed cell values input to produce output cell values that are output by the sense amplifiers of the first portion.

10. A ROM, comprising:
an array of memory cells grouped into sets of memory cells, each set including one or more columns of memory cells, the cells of each set including at least as many unprogrammed cells as programmed cells, where each programmed cell includes a cell transistor and each unprogrammed cell does not include a cell transistor; and a plurality of sense amplifiers, a first portion of the sense amplifiers being inverting sense amplifiers and a second portion of the sense amplifiers being non-inverting sense amplifiers, wherein the sense amplifiers of the second portion each include two stages interconnected by two differential lines that are not cross-coupled.

* * * * *

UNITED STATES PATENT AND TRADEMARK OFFICE
CERTIFICATE OF CORRECTION

PATENT NO.    : 6,363,001 B1
DATED         : March 26, 2002
INVENTOR(S)   : Bertrand Borot et al.

It is certified that error appears in the above-identified patent and that said Letters Patent is hereby corrected as shown below:

<u>Title page,</u>
Item [73], the assignee should read -- STMicroelectronics S.A., Gentilly (FR) --.

Signed and Sealed this

Twenty-third Day of July, 2002

Attest:

Attesting Officer

JAMES E. ROGAN
*Director of the United States Patent and Trademark Office*